US010743660B2

(12) United States Patent
Chen et al.

(10) Patent No.: US 10,743,660 B2
(45) Date of Patent: Aug. 18, 2020

(54) SLIDE RAIL ASSEMBLY AND RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 67 days.

(21) Appl. No.: 15/960,706

(22) Filed: Apr. 24, 2018

(65) Prior Publication Data
US 2019/0159593 A1   May 30, 2019

(30) Foreign Application Priority Data

Nov. 27, 2017  (TW) .............................. 106141490 A (51) Int. Cl.
| *A47B 88/473* | (2017.01) |
| *A47B 88/40* | (2017.01) |
| *H05K 7/14* | (2006.01) |
| *A47B 88/57* | (2017.01) |
| *A47B 88/49* | (2017.01) |
| *A47B 88/483* | (2017.01) |

(52) U.S. Cl.
CPC ............ *A47B 88/473* (2017.01); *A47B 88/40* (2017.01); *A47B 88/483* (2017.01); *A47B 88/49* (2017.01); *A47B 88/57* (2017.01); *H05K 7/1489* (2013.01)

(58) Field of Classification Search
CPC ..... A47B 88/473; A47B 88/49; A47B 88/483; A47B 88/40; A47B 88/57
See application file for complete search history.

(56) References Cited

U.S. PATENT DOCUMENTS

| 5,484,197 | A | * | 1/1996 | Hansen | .................. A47B 88/42 312/334.12 |
| 6,412,891 | B1 | | 7/2002 | Liang et al. | |
| 6,851,774 | B2 | | 2/2005 | Chen et al. | |
| 6,935,710 | B2 | | 8/2005 | Chen et al. | |
| 9,538,845 | B1 | * | 1/2017 | Chen | ...................... A47B 88/49 |
| 9,854,909 | B1 | * | 1/2018 | Chiu | .................... A47B 88/487 |
| 9,992,906 | B2 | * | 6/2018 | Chen | ..................... F16C 29/123 |
| 2004/0174100 | A1 | * | 9/2004 | Chen | ...................... A47B 88/50 312/333 |
| 2007/0164645 | A1 | * | 7/2007 | Chen | .................... A47B 88/487 312/334.47 |

(Continued)

*Primary Examiner* — Daniel J Troy
*Assistant Examiner* — Ryan A Doyle
(74) *Attorney, Agent, or Firm* — Rosenberg, Klein & Lee (57) ABSTRACT

A slide rail assembly includes a first rail, a second rail, a first locking mechanism, a second locking mechanism, and an operating member. The second rail can be displaced with respect to the first rail. The first locking mechanism and the second locking mechanism are configured to keep the second rail at either of two predetermined positions. The operating member can be used to operate the first locking mechanism and the second locking mechanism and thereby bring the locking mechanisms from a locked state to an unlocked state.

19 Claims, 12 Drawing Sheets

(56) References Cited

U.S. PATENT DOCUMENTS

| | | | |
|---|---|---|---|
| 2008/0111457 A1* | 5/2008 | Ji ........................ | A47B 88/493 312/334.44 |
| 2008/0197758 A1* | 8/2008 | Mushan ............... | A47B 88/493 312/334.1 |
| 2009/0096340 A1* | 4/2009 | Chen .................... | A47B 88/493 312/334.46 |
| 2012/0043872 A1* | 2/2012 | Enos .................... | A47B 88/493 312/332.1 |
| 2013/0259410 A1* | 10/2013 | Judge ................... | F16C 29/04 384/49 |
| 2013/0259411 A1* | 10/2013 | Judge ................... | F16C 29/04 384/49 |
| 2016/0227666 A1* | 8/2016 | Chen .................... | H05K 7/1489 |

* cited by examiner

SLIDE RAIL ASSEMBLY AND RAIL KIT THEREOF

FIELD OF THE INVENTION

The present invention relates to a slide rail and more particularly to a slide rail assembly with a two-stage locking function.

BACKGROUND OF THE INVENTION

Generally, a slide rail assembly includes a first rail and a second rail displaceable with respect to the first rail. When the second rail reaches a predetermined position after displacement with respect to the first rail in a particular direction, there is typically a blocking structure between the second rail and the first rail to prevent the second rail from further displacement with respect to the first rail in that particular direction, thereby keeping the second rail at the predetermined position. With the advancement of technology, a similar product has emerged in which not only can a second rail be kept at a predetermined position with respect to a first rail by a blocking mechanism, but also the blocking mechanism can be deactivated by an operating member to allow further displacement of the second rail with respect to the first rail in a certain direction. U.S. Pat. No. 6,412,891 B1, for example, discloses a slide rail assembly that includes an outer member (20), an inner member (30), a stop member (50), and a pivot member (70), wherein the pivot member (70) is pivotally connected to the inner member (30) such that, when the inner member (30) is at a predetermined position with respect to the outer member (20), the stop member (50) blocks the pivot member (70) and thereby prevents the inner member (30) from inadvertent displacement with respect to the outer member (20).

As market demands vary, however, it has been an important issue in the related industries to devise a different slide rail product by furnishing a slide rail assembly with an at least two-stage locking mechanism.

SUMMARY OF THE INVENTION

The present invention provides a slide rail assembly having a two-stage locking function.

According to one aspect of the present invention, a slide rail assembly includes a first rail, a second rail, a first locking mechanism, a second locking mechanism, and an operating member. The first rail has a front end and a blocking portion. The second rail can be displaced with respect to the first rail and has a first portion and a second portion. The first locking mechanism is arranged at a first position of the second rail, and the second locking mechanism is arranged at a second position of the second rail. The operating member is operatively connected to the first locking mechanism and the second locking mechanism. When the second rail reaches a first predetermined position after displacement from a retracted position with respect to the first rail in a first direction, the first locking mechanism is locked to the blocking portion of the first rail, with the first portion of the second rail extending beyond the front end of the first rail. The first locking mechanism can be unlocked from the blocking portion through operation of the operating member, thereby allowing the second rail to be displaced with respect to the first rail from the first predetermined position to a second predetermined position in the first direction. Once the second rail reaches the second predetermined position, the second locking mechanism is locked to the blocking portion of the first rail, with the second portion of the second rail extending beyond the front end of the first rail. The first locking mechanism and the second locking mechanism can then be driven from the locked state into an unlocked state through operation of the operating member, thereby allowing the second rail to be retracted with respect to the first rail in a second direction.

Preferably, the first rail has a rear end, and the blocking portion lies between the front end and the rear end.

Preferably, the blocking portion is adjacent to the front end of the first rail.

Preferably, the first locking mechanism includes a first element and a second element, and the first element and the second element are pivotally connected to the second rail.

Preferably, the slide rail assembly further includes a first base. The first base includes a first elastic portion and a second elastic portion for providing an elastic force to the first element and the second element respectively.

Preferably, the first element includes a first guiding feature and can be moved over a first side of the blocking portion to a second side of the blocking portion in the first direction by means of the first guiding feature.

Preferably, the first guiding feature is an inclined surface or a curved surface.

Preferably, the first element and the second element are located at the two sides of the blocking portion respectively and hence in the locked state when the second rail is at the first predetermined position.

Preferably, the first element and the second element can be brought from the locked state to the unlocked state through operation of the operating member, thereby allowing the second rail to be displaced with respect to the first rail from the first predetermined position toward the second predetermined position in the first direction.

Preferably, the second locking mechanism includes a third element pivotally connected to the second rail.

Preferably, the slide rail assembly further includes a second base. The second base includes a third elastic portion for providing an elastic force to the third element.

Preferably, the third element includes a guiding structure and can be moved over the first side of the blocking portion to the second side of the blocking portion in the first direction by means of the guiding structure.

Preferably, the guiding structure is an inclined surface or a curved surface.

Preferably, the third element is located at the second side of the blocking portion and hence in the locked state when the second rail is at the second predetermined position.

Preferably, the third element, the second element, and the first element can be brought from the locked state to the unlocked state through operation of the operating member, thereby allowing the second rail to be retracted with respect to the first rail from the second predetermined position in the second direction.

Preferably, the second element includes a guiding portion, and the guiding portion is an inclined surface or a curved surface to help the second element move over the second side of the blocking portion to the first side of the blocking portion.

Preferably, the first element further includes a second guiding feature, and the second guiding feature is an inclined surface or a curved surface to help the first element move over the second side of the blocking portion.

Preferably, the slide rail assembly further includes a third rail, and the first rail is movably mounted between the third rail and the second rail.

According to another aspect of the present invention, a rail kit includes a slide rail, a first locking mechanism, a second locking mechanism, and an operating member. The first locking mechanism and the second locking mechanism are arranged at two different positions of the slide rail respectively. The operating member is configured for operating the first locking mechanism and the second locking mechanism and thereby bringing the first locking mechanism and the second locking mechanism from a locked state to an unlocked state.

DETAILED DESCRIPTION OF THE INVENTION

Figure 1:
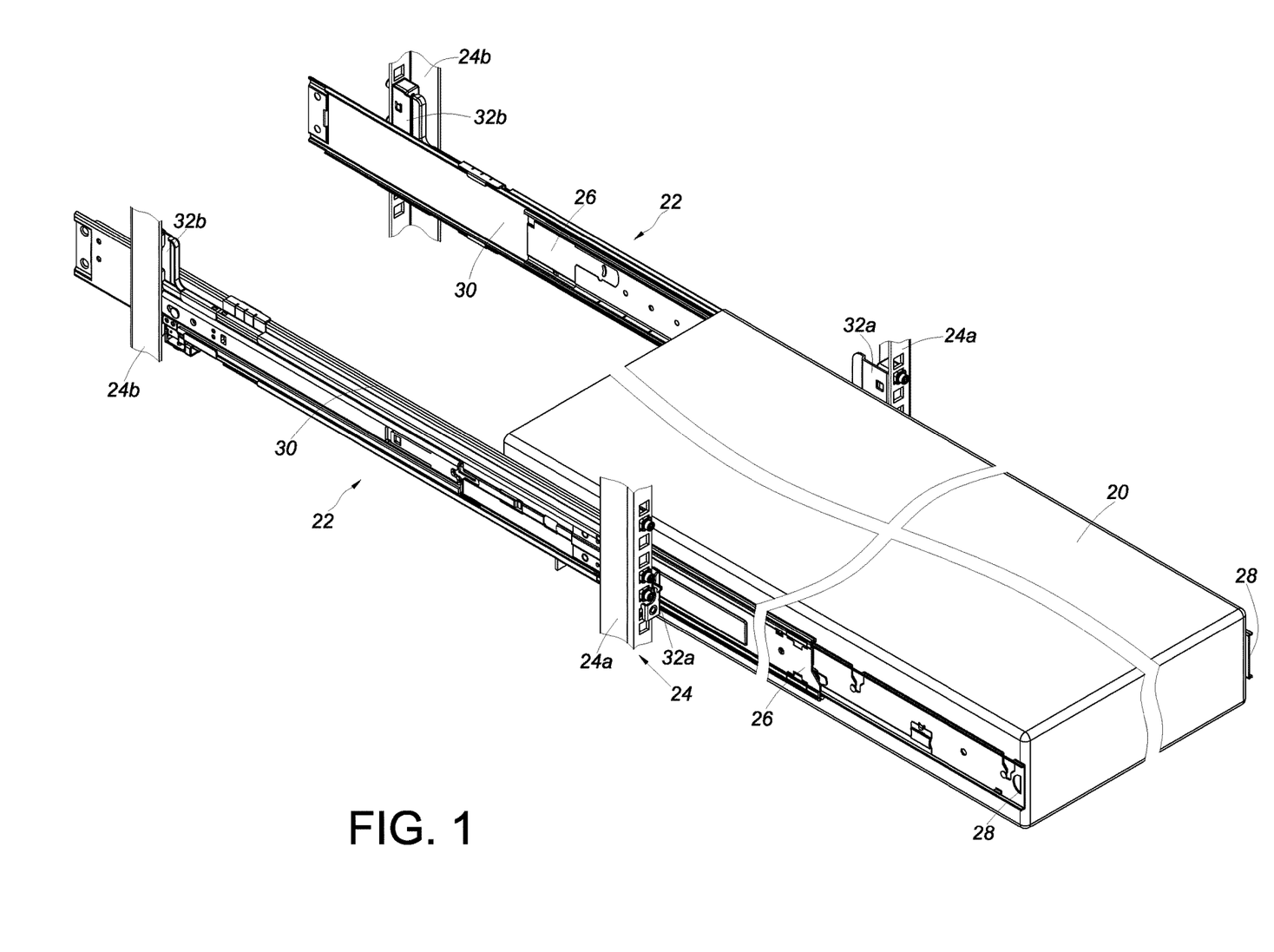
FIG. 1 is a perspective view showing how an object is mounted on a rack through a pair of slide rail assemblies according to an embodiment of the present invention.

Referring to FIG. 1, an object 20 is mounted on the plural posts (e.g., a pair of first posts 24a and a pair of second posts 24b) of a rack 24 via a pair of slide rail assemblies 22 according to an embodiment of the present invention. Each slide rail assembly 22 includes a first rail 26, a second rail 28, and preferably also a third rail 30, wherein the first rail 26 is movably mounted between the third rail 30 and the second rail 28. Each third rail 30 is mounted on the corresponding first post 24a and the corresponding second post 24b through a first bracket 32a and a second bracket 32b respectively. The second rails 28 are used to carry the object 20 so that the object 20 can be pulled out of and then pushed back into the rack 24 by means of the second rails 28.

Figure 2:
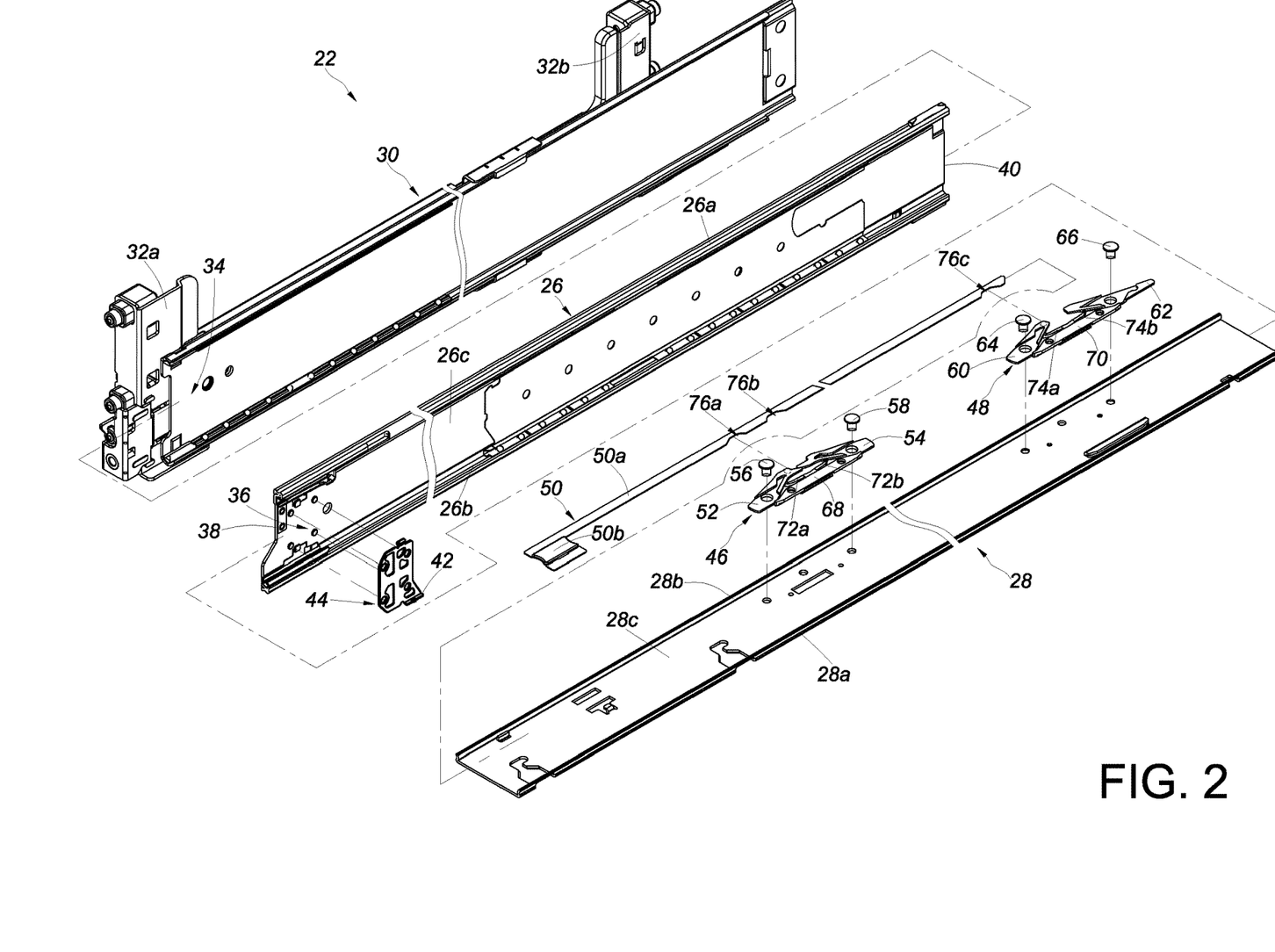
FIG. 2 is an exploded perspective view of the slide rail assembly according to an embodiment of the present invention.
Figure 3:
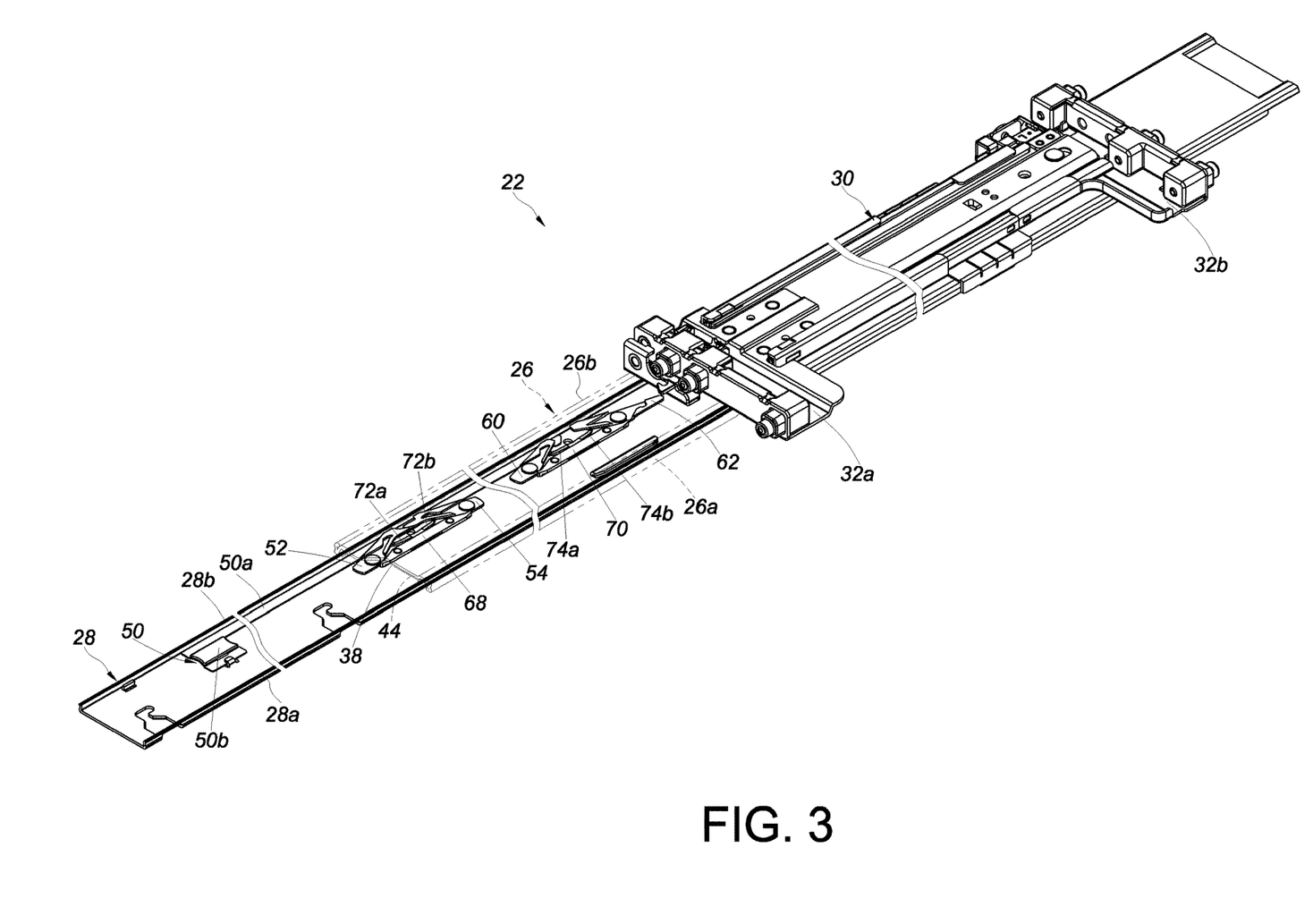
FIG. 3 is an assembled perspective view of the slide rail assembly according to an embodiment of the present invention.

Referring to FIG. 2 and FIG. 3, the first bracket 32a and the second bracket 32b are respectively arranged at two portions (e.g., a front portion and a rear portion) of the third rail 30 of the slide rail assembly 22, and the third rail 30 defines a first channel 34.

The first rail 26 is movably mounted in the first channel 34 of the third rail 30. The first rail 26 includes a first wall 26a, a second wall 26b, and a sidewall 26c connected between the first wall 26a and the second wall 26b. The first wall 26a, the second wall 26b, and the sidewall 26c jointly define a second channel 36. More specifically, the first rail 26 has a front end 38, a rear end 40, and a blocking portion 42. The blocking portion 42 lies between the front end 38 and the rear end 40 and is in the second channel 36, preferably adjacent to the front end 38 of the first rail 26. The blocking portion 42 may be a protruding element integrated with the sidewall 26c of the first rail 26, or a fitting 44 including the blocking portion 42 may be connected to the first rail 26 by riveting, soldering, or threaded connection such that the blocking portion 42 protrudes from the sidewall 26c of the first rail 26; the present invention has no limitation in this regard. The second rail 28 is movably mounted in the second channel 36 of the first rail 26.

Figure 4:
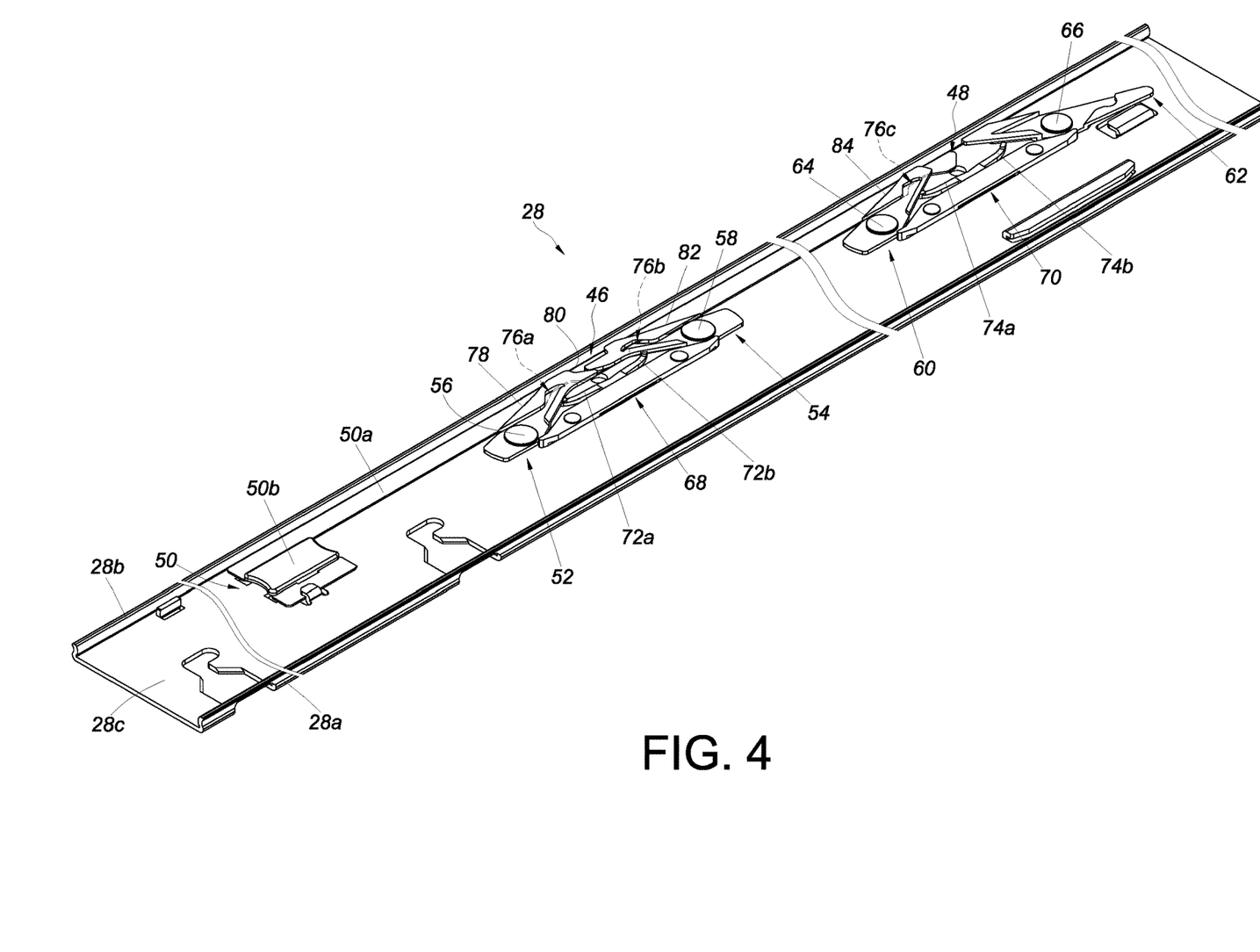
FIG. 4 is a perspective view of one of the slide rails of the slide rail assembly according to an embodiment of the present invention.

As shown in FIG. 2 and FIG. 4, the second rail 28 includes a first wall 28a, a second wall 28b, and a sidewall 28c connected between the first wall 28a and the second wall 28b. The slide rail assembly 22 further includes a first locking mechanism 46, a second locking mechanism 48, and an operating member 50. The first locking mechanism 46 and the second locking mechanism 48 are arranged at a first position and a second position of the second rail 28 respectively. For example, the first locking mechanism 46 is closer to the front end of the second rail 28 than the second locking mechanism 48, and the second locking mechanism 48 is closer to the rear end of the second rail 28 than the first locking mechanism 48. In practice, however, the two locking mechanisms are not necessarily so arranged. More specifically, the first locking mechanism 46 and the second locking mechanism 48 are located on the sidewall 28c of the second rail 28 and are spaced apart from each other. The second rail 28 (also referred to herein as the slide rail), the first locking mechanism 46, the second locking mechanism 48, and the operating member 50 constitute a rail kit.

The first locking mechanism 46 includes a first element 52 and a second element 54. The first element 52 and the second element 54 are pivotally connected to the sidewall 28c of the second rail 28 by a first shaft 56 and a second shaft 58 respectively.

The second locking mechanism 48 includes a third element 60 and preferably also a fourth element 62. The third element 60 and the fourth element 62 are pivotally connected to the sidewall 28c of the second rail 28 by a third shaft 64 and a fourth shaft 66 respectively.

Preferably, the slide rail assembly 22 or the rail kit further includes a first base 68 and a second base 70. The first base 68 includes a first elastic portion 72a and a second elastic portion 72b for providing an elastic force to the first element 52 and the second element 54 respectively. The second base 70 includes a third elastic portion 74a and a fourth elastic portion 74b for providing an elastic force to the third element 60 and the fourth element 62 respectively.

The operating member 50 is configured to operate the first locking mechanism 46 and the second locking mechanism 48. For example, the operating member 50 can be used to operate the first element 52 and the second element 54 of the first locking mechanism 46 and the third element 60 of the second locking mechanism 48. Here, by way of example, the operating member 50 is arranged at the second rail 28 and is operatively connected to the first element 52 and the second element 54 of the first locking mechanism 46 and the third element 60 of the second locking mechanism 48.

More specifically, the operating member 50 includes an extension portion 50a, and the extension portion 50a has a predetermined length extending in the same direction as the length of the second rail 28. Preferably, the operating member 50 further includes an operating portion 50b connected to the extension portion 50a. The extension portion 50a includes a plurality of driving structures such as a first driving structure 76a, a second driving structure 76b, and a third driving structure 76c arranged sequentially along the length of the extension portion 50a. The operating member 50 operates the first element 52, the second element 54, and the third element 60 through the driving structures 76a, 76b, and 76c respectively.

Preferably, the first element 52 includes a first guiding feature 78 and a second guiding feature 80. The first guiding feature 78 is an inclined surface or a curved surface, and the second guiding feature 80 is an inclined surface or a curved surface. Preferably, the second element 54 includes a guiding portion 82, and the guiding portion 82 is an inclined surface or a curved surface. Preferably, the third element 60 includes a guiding structure 84, and the guiding structure 84 is an inclined surface or a curved surface.

Figure 5:
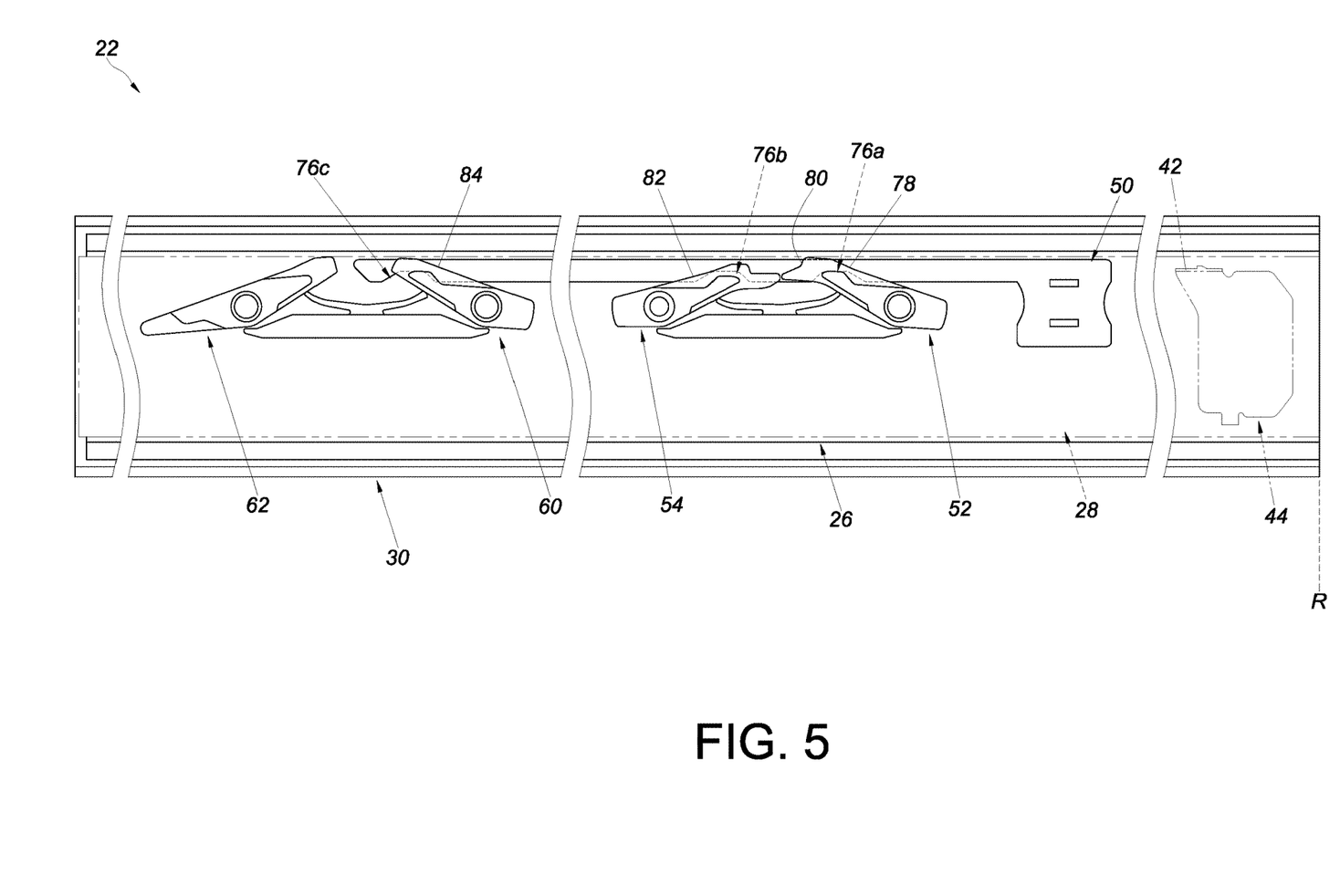
FIG. 5 shows the slide rail assembly according to an embodiment of the present invention in a retracted state.

Referring to FIG. 5, in which the slide rail assembly 22 is shown in a retracted state, the first rail 26 is retracted with respect to the third rail 30, and the second rail 28 is at a retracted position R with respect to the first rail 26.

Figure 6:
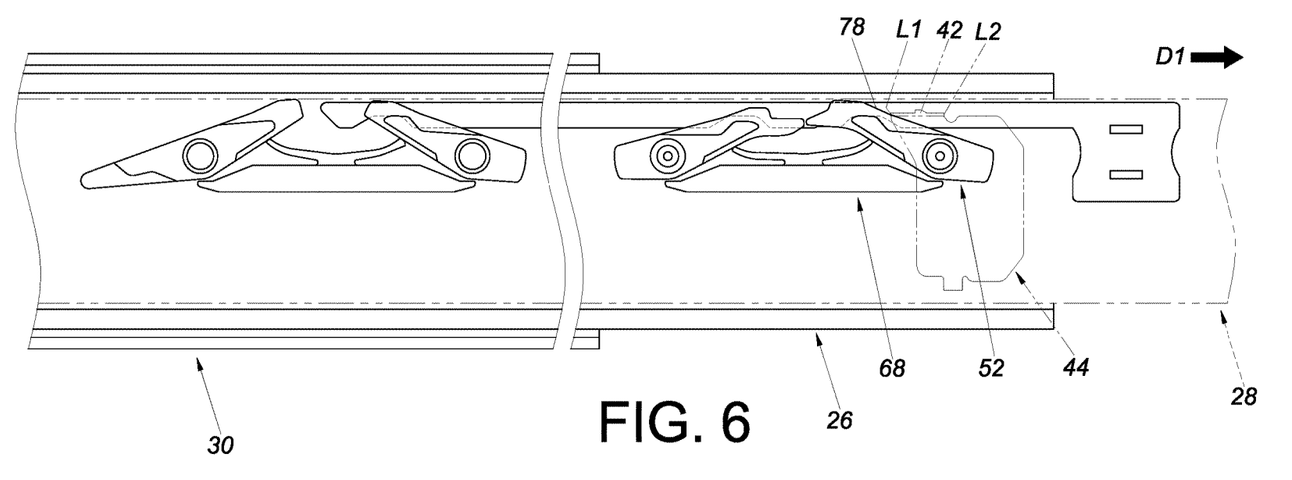
FIG. 6 shows that the second rail of the slide rail assembly is displaced with respect to the first rail in a first direction according to an embodiment of the present invention.

Referring to FIG. 6, the second rail 28 is displaced from the retracted position R with respect to the first rail 26 in a first direction D1 (e.g., an opening direction), and while the second rail 28 goes through a predetermined section of the extending process, the first guiding feature 78 of the first element 52 is in contact with a first side L1 of the blocking portion 42 of the first rail 26.

Figure 7:
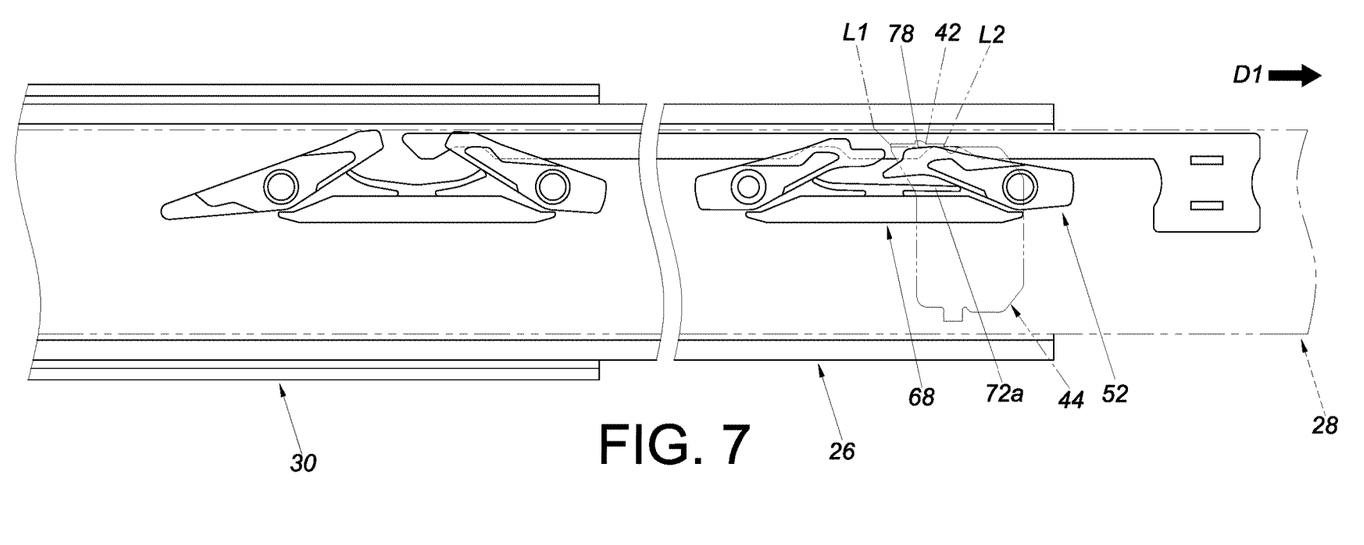
FIG. 7 shows that the second rail of the slide rail assembly is further displaced with respect to the first rail in the first direction according to an embodiment of the present invention.

When the second rail 28 is further displaced in the first direction D1, as shown in FIG. 7, the first element 52 is tilted by an angle due to the contact between the first guiding feature 78 and the first side L1 of the blocking portion 42. The tilt allows the first element 52 to move over the first side L1 of the blocking portion 42 of the first rail 26 in the first direction D1 such that the first elastic portion 72a of the first base 68 stores a certain amount of elastic energy.

Figure 8:
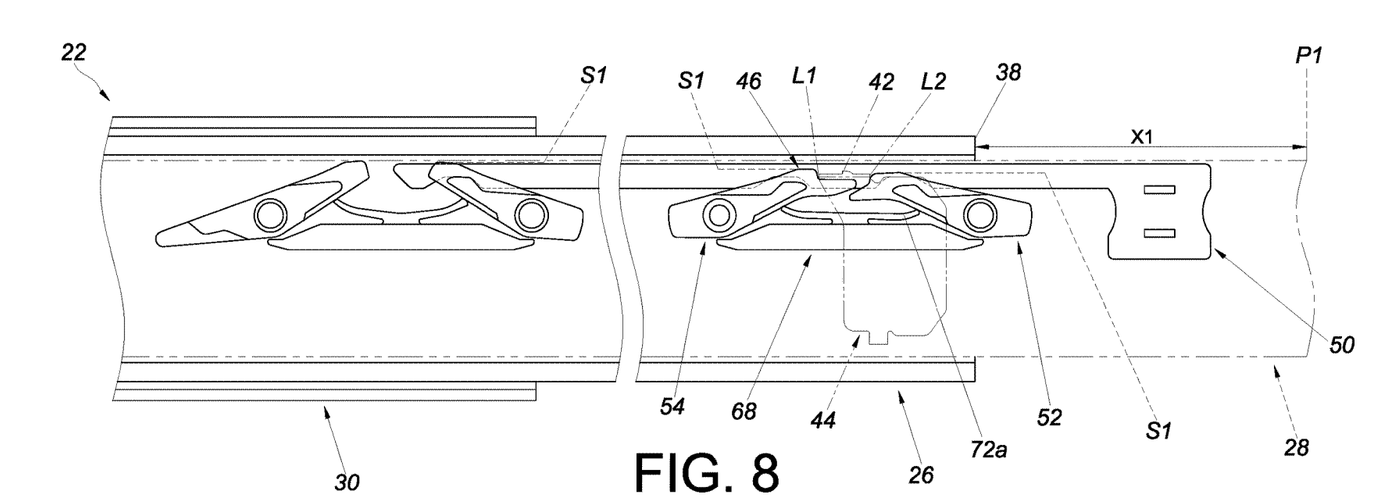
FIG. 8 shows that the second rail of the slide rail assembly reaches a first predetermined position after displacement with respect to the first rail in the first direction, and that the first locking mechanism is locked to the blocking portion of the first rail according to an embodiment of the present invention.

When the second rail 28 reaches a first predetermined position P1 after further displacement in the first direction D1 with respect to the first rail 26, as shown in FIG. 8, the slide rail assembly 22 enters a first extended state, in which the first locking mechanism 46 is locked to the blocking portion 42 of the first rail 26, with a first portion X1 of the second rail 28 extending beyond the front end 38 of the first rail 26. For example, when the second rail 28 reaches the first predetermined position P1 after displacement with respect to the first rail 26 in the first direction D1, the first element 52 arrives at a second side L2 of the blocking portion 42 in response to the elastic energy released by the first elastic portion 72a of the first base 68. On the other hand, the second element 54 reaches the first side L1 of the blocking portion 42. Thus, the first element 52 and the second element 54 are located at the two sides of the blocking portion 42 respectively and are in a locked state S1 to prevent the second rail 28 from inadvertent displacement with respect to the first rail 26.

Figure 9:
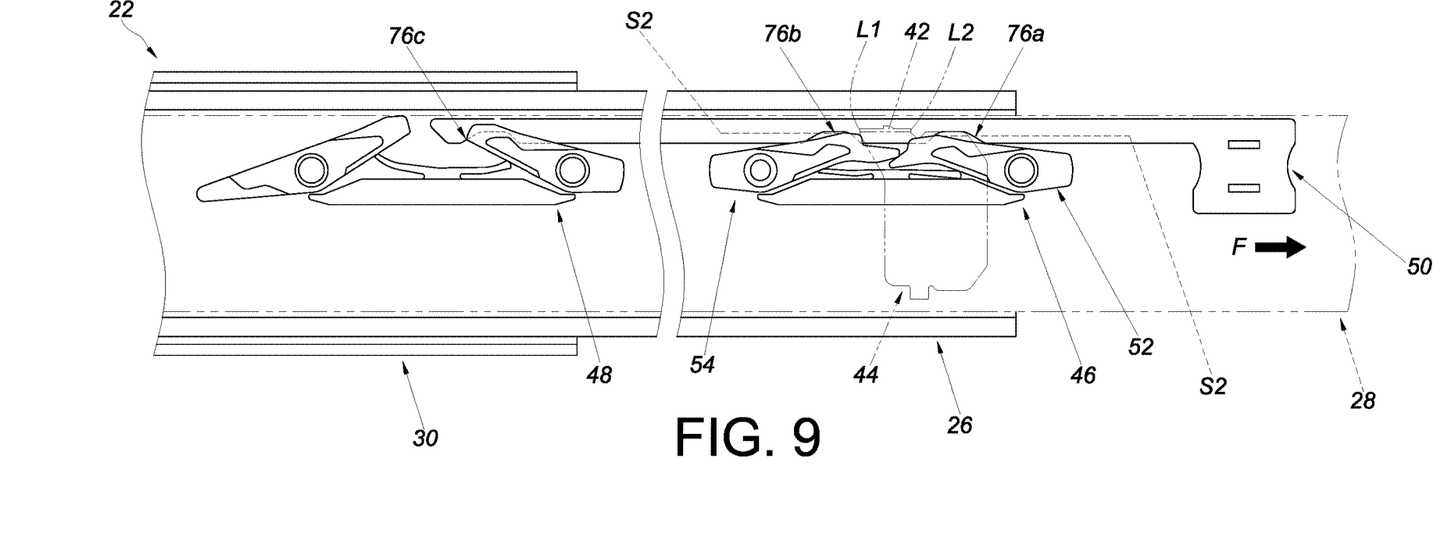
FIG. 9 shows that the second rail of the slide rail assembly reaches a first predetermined position according to an embodiment of the present invention, with the first locking mechanism not yet being unlocked from the blocking portion of the first rail by the operating member.

Referring to FIG. 9, the operating member 50 can then be operated to unlock the first locking mechanism 46 from the blocking portion 42. For example, a user can apply a force F to and thereby operate the operating member 50 in order for the operating member 50 to drive the first element 52 and the second element 54 from the locked state S1 into an unlocked state S2, allowing the second rail 28 to be further displaced from the first predetermined position P1 with respect to the first rail 26.

Figure 10:
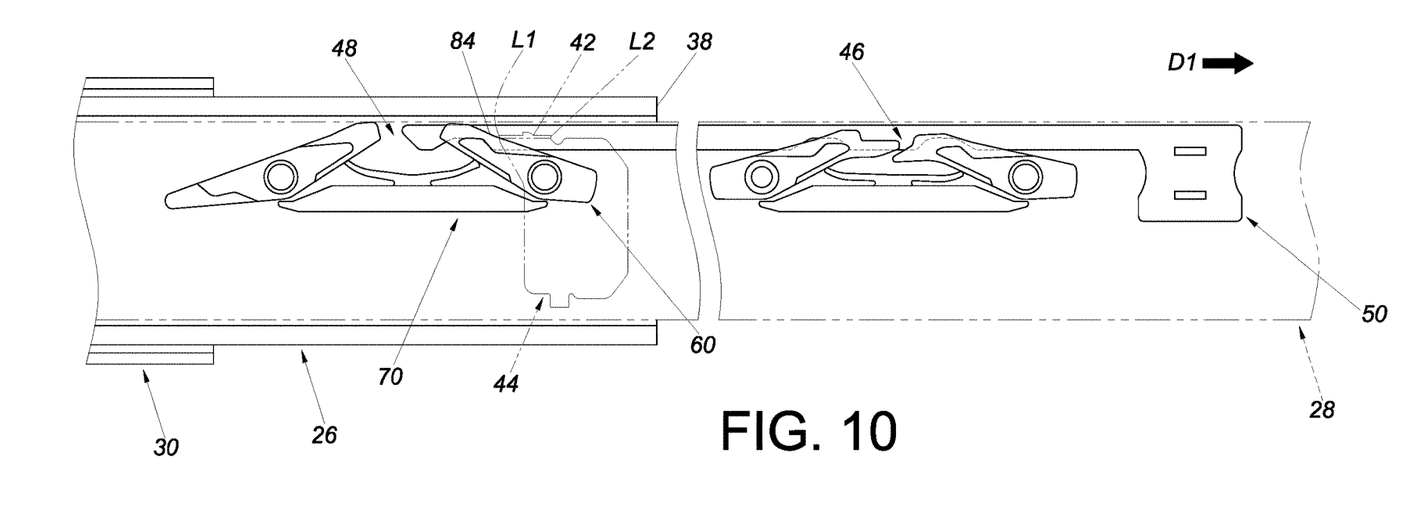
FIG. 10 shows that the second rail of the slide rail assembly is further displaced with respect to the first rail in the first direction according to an embodiment of the present invention.

Once the first locking mechanism 46 is unlocked from the blocking portion 42, the second rail 28 can be displaced from the first predetermined position P1 with respect to the first rail 26 in the first direction D1, as shown in FIG. 10. The guiding structure 84 of the third element 60 of the second locking mechanism 48 is in contact with the first side L1 of the blocking portion 42 of the first rail 26 while the second rail 28 goes through a predetermined section of the extending process.

Figure 11:
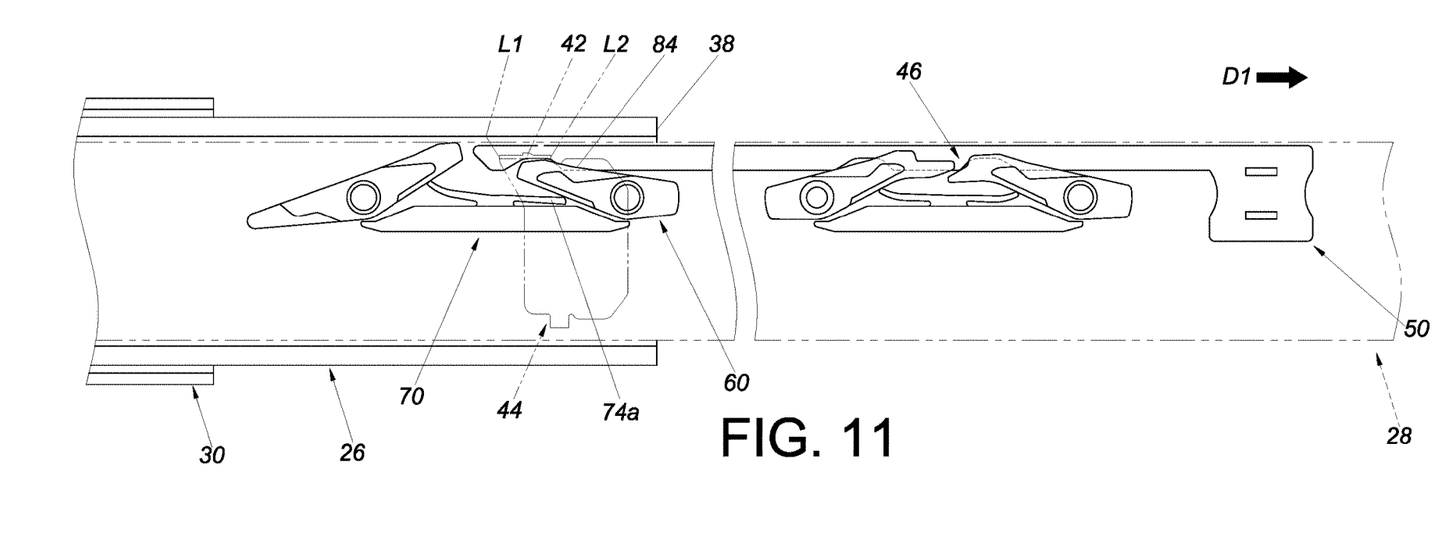
FIG. 11 shows that the second rail of the slide rail assembly is further displaced with respect to the first rail in the first direction according to an embodiment of the present invention.

When the second rail 28 is further displaced in the first direction D1, as shown in FIG. 11, the third element 60 is tilted by an angle due to the contact between the guiding structure 84 and the first side L1 of the blocking portion 42. The tilt allows the third element 60 to move over the first side L1 of the blocking portion 42 of the first rail 26 in the first direction D1 such that the third elastic portion 74a of the second base 70 stores a certain amount of elastic energy.

Figure 12:
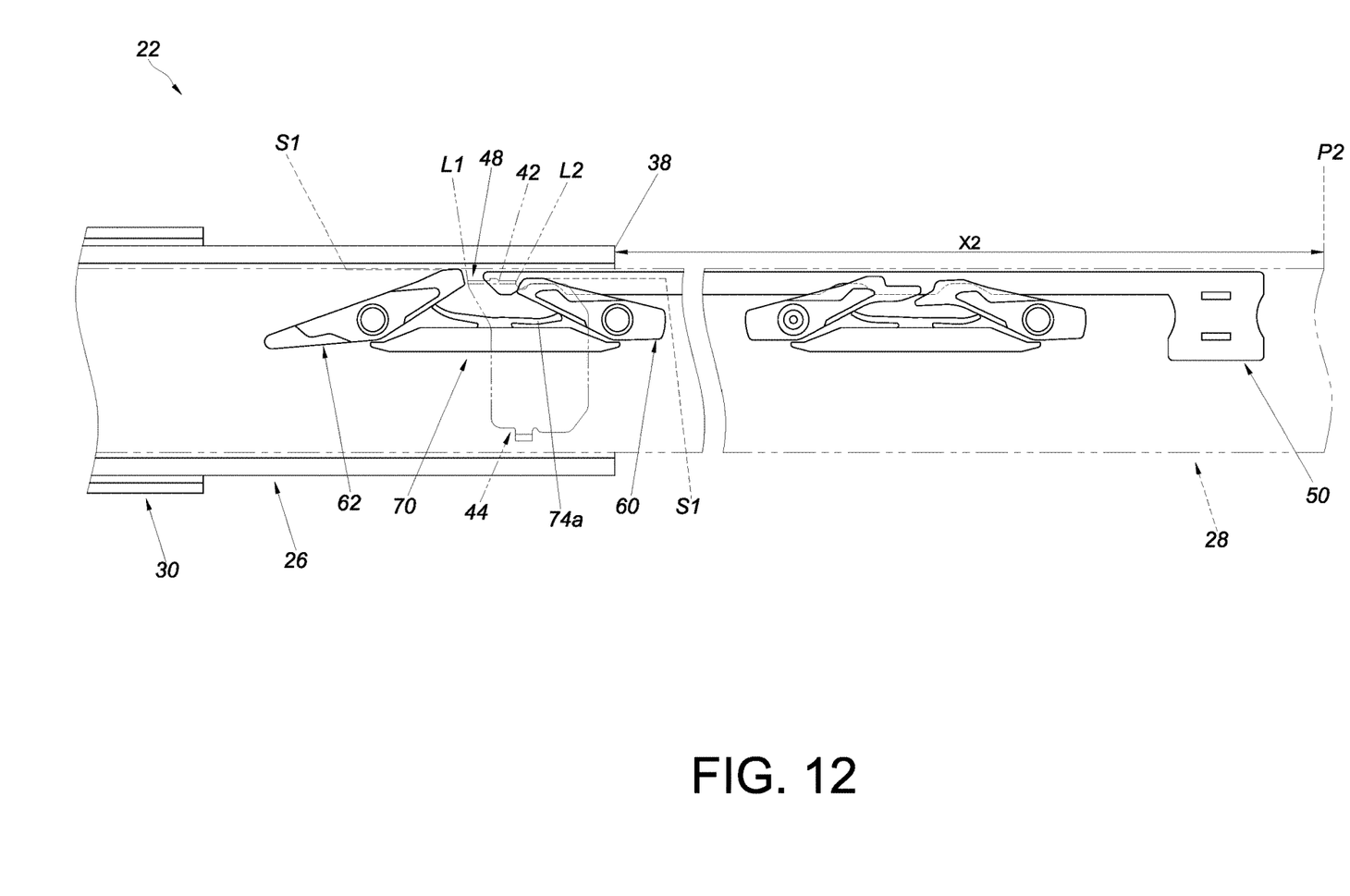
FIG. 12 shows that the second rail of the slide rail assembly reaches a second predetermined position after displacement with respect to the first rail in the first direction, and that the second locking mechanism is locked to the blocking portion of the first rail according to an embodiment of the present invention.

When the second rail 28 reaches a second predetermined position P2 after further displacement in the first direction D1 with respect to the first rail 26, as shown in FIG. 12, the slide rail assembly 22 enters a second extended state, in which the second locking mechanism 48 is locked to the blocking portion 42 of the first rail 26, with a second portion X2 of the second rail 28 extending beyond the front end 38 of the first rail 26. For example, when the second rail 28 reaches the second predetermined position P2 after displacement with respect to the first rail 26 in the first direction D1, the third element 60 arrives at the second side L2 of the blocking portion 42 in response to the elastic energy released by the third elastic portion 74a of the second base 70. On the other hand, the fourth element 62 reaches the first side L1 of the blocking portion 42. Thus, the third element 60 and the fourth element 62 are located at the two sides of the blocking portion 42 respectively and are in a locked state S1 to prevent the second rail 28 from inadvertent displacement with respect to the first rail 26.

Figure 13:
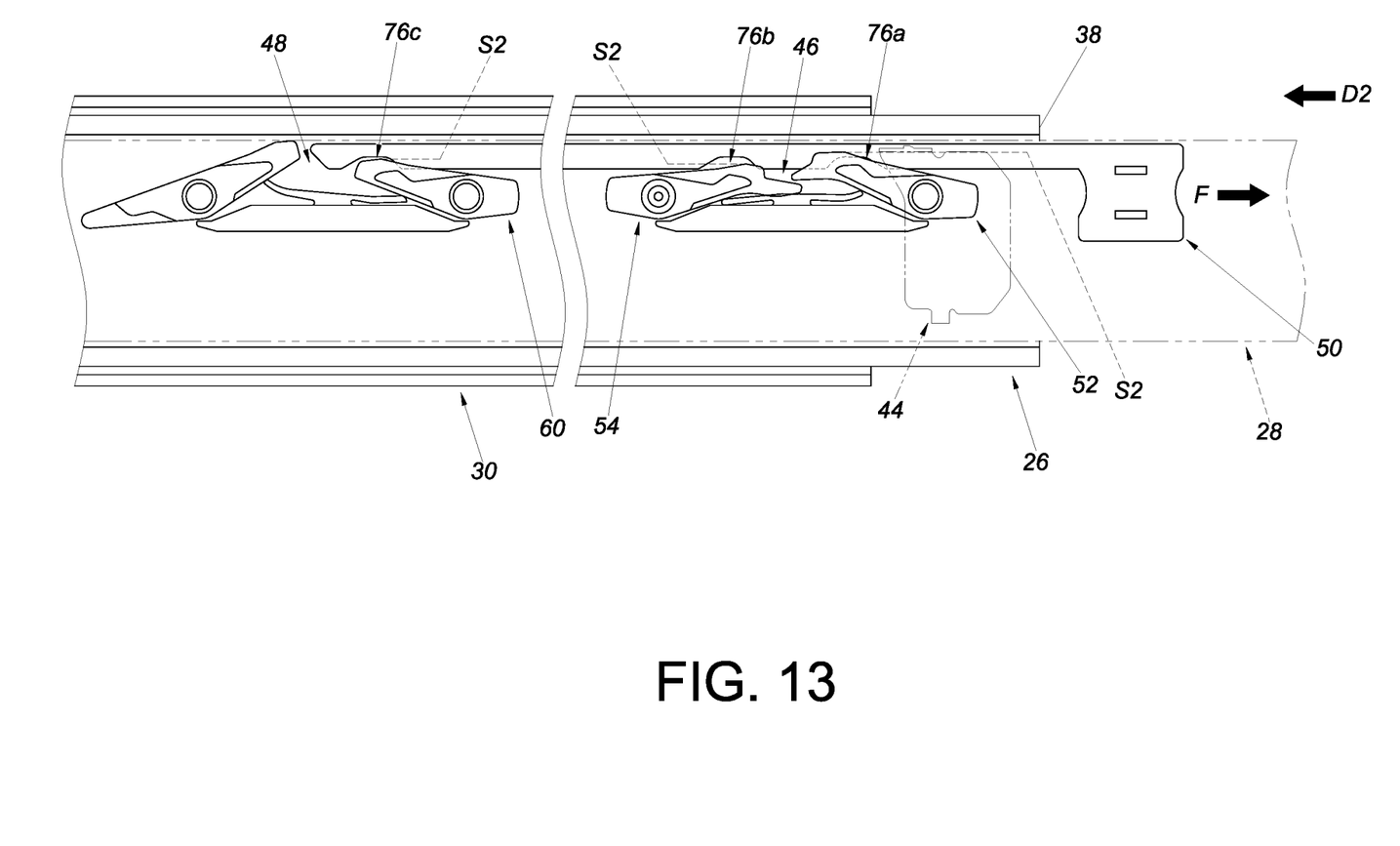
FIG. 13 shows the first operation mode of retracting the second rail of the slide rail assembly with respect to the first rail in a second direction according to an embodiment of the present invention, wherein the first operation mode involves operating the operating member to bring the related elements of the second locking mechanism and of the first locking mechanism from the locked state to the unlocked state.

FIG. 13 shows the first operation mode of retracting the second rail 28 with respect to the first rail 26. The first operation mode involves the use of the operating member 50, which can operate the third element 60, the second element 54, and the first element 52 through the third driving structure 76c, the second driving structure 76b, and the first driving structure 76a respectively. For example, a user can apply a force F to the operating member 50 and thereby drive the third element 60 of the second locking mechanism 48 and the second element 54 and the first element 52 of the first locking mechanism 46 from the locked state S1 into the unlocked state S2, so the second rail 28 can be retracted with respect to the first rail 26 from the second predetermined position P2 in a second direction D2.

It can be known from the above that the operating member 50 can operate the first locking mechanism 46 and the second locking mechanism 48 at the same time, allowing the second rail 28 to be retracted from the second predetermined position P2 to the retracted position R in the second direction D2.

Figure 14:
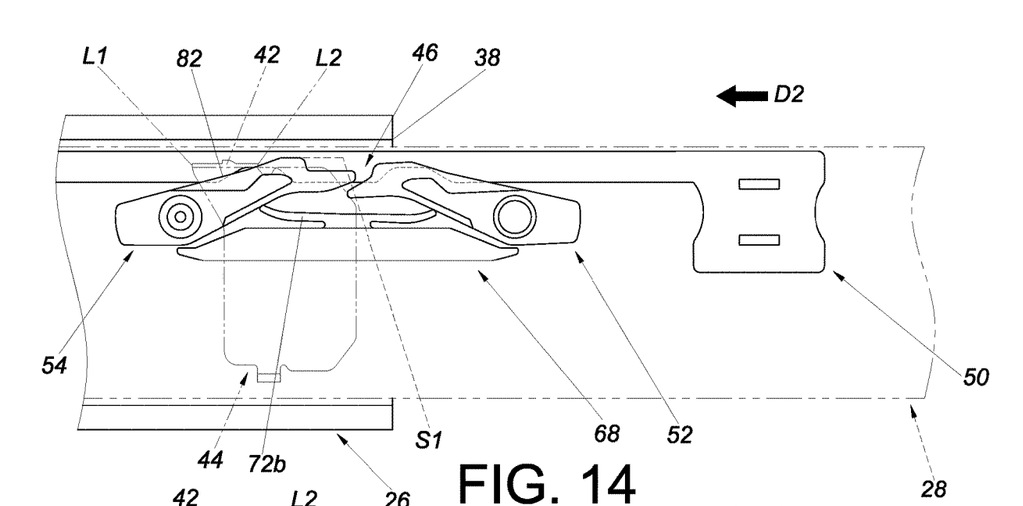
FIG. 14 shows the second operation mode of retracting the second rail of the slide rail assembly with respect to the first rail in the second direction according to an embodiment of the present invention, wherein the second operation mode involves retracting the second rail as desired.

FIG. 14 shows the second operation mode of retracting the second rail 28 with respect to the first rail 26.

The second operation mode is applicable when the second rail 28 is at the second predetermined position P2 with respect to the first rail 26 and when the second locking mechanism 48 is unlocked from the blocking portion 42 (see FIG. 12). More specifically, the second rail 28 is retracted with respect to the first rail 26 in the second direction D2, and while the second rail 28 goes through a predetermined section of the retracting process, the guiding portion 82 of the second element 54 is in contact with the second side L2 of the blocking portion 42 while in the locked state S1.

Figure 15:
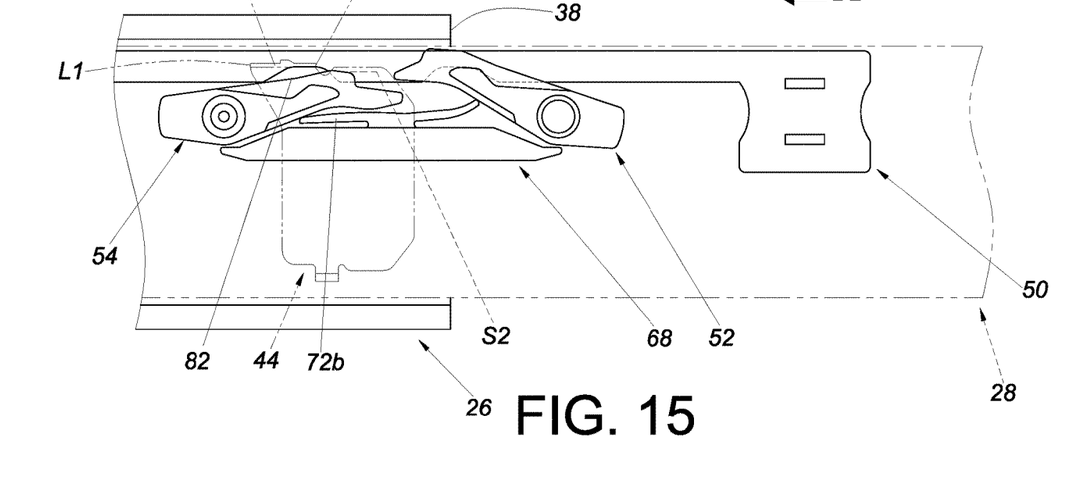
FIG. 15 shows that the second rail of the slide rail assembly is further retracted with respect to the first rail in the second direction according to an embodiment of the present invention.

When the second rail 28 is further displaced with respect to the first rail 26 in the second direction D2, as shown in FIG. 15, the second element 54 is tilted by an angle due to the contact between the guiding portion 82 and the second side L2 of the blocking portion 42 and thus enters the unlocked state S2. The second element 54, therefore, can be moved over the second side L2 of the blocking portion 42 of the first rail 26 in the second direction D2, with the second elastic portion 72b of the first base 68 storing a certain amount of elastic energy as a result.

Figure 16:
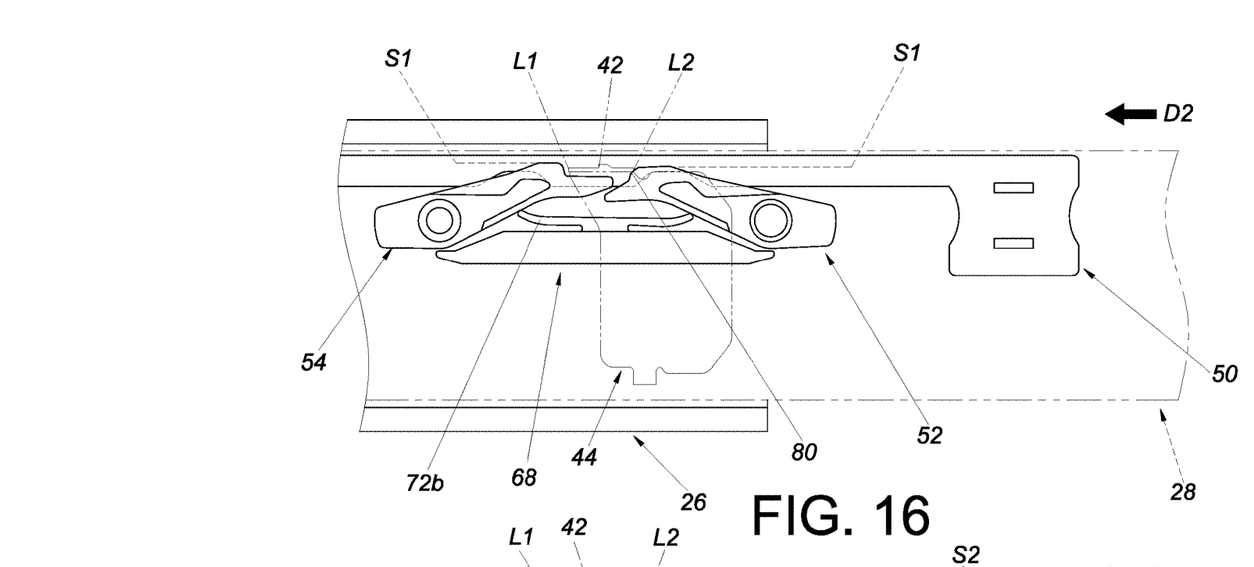
FIG. 16 shows that the second rail of the slide rail assembly is further retracted with respect to the first rail in the second direction according to an embodiment of the present invention, thereby bringing an element of the first locking mechanism to a certain state.
Figure 17:
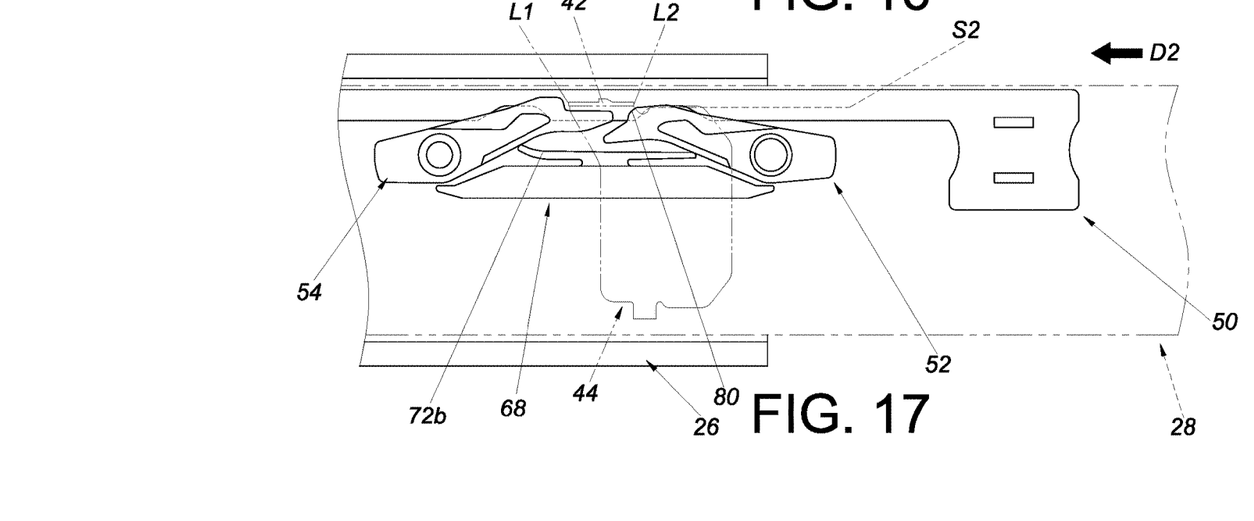
FIG. 17 shows that the element of the first locking mechanism enters another state according to an embodiment of the present invention.

When the second rail 28 is further displaced with respect to the first rail 26 in the second direction D2, as shown in FIG. 16 and FIG. 17, the second element 54 will be moved over the second side L2 of the blocking portion 42 and reach the first side L1 of the blocking portion 42. During the process, the second elastic portion 72b of the first base 68 will release the stored elastic energy, bringing the second element 54 back to the locked state S1. The first element 52, on the other hand, will contact the second side L2 of the blocking portion 42 through the second guiding feature 80 while in the locked state S1. Moreover, the first element 52 will be tilted by an angle due to the contact between the second guiding feature 80 and the second side L2 of the blocking portion 42 and thus enter the unlocked state S2, in which the first element 52 can be moved over the second side L2 of the blocking portion 42. The operation described above works equally well to retract the second rail 28 with respect to the first rail 26 in the second direction D2.

According to the above, the slide rail assembly disclosed herein preferably has the following features:

1. The disclosed slide rail assembly 22 has a two-stage locking mechanism so that, while the second rail 28 is at the second predetermined position P2 with respect to the first rail 26, a user can retract the second rail 28 with respect to the first rail 26 from the second predetermined position P2 in the second direction D2 using the first operation mode, i.e., with the operating member 50 driving the first locking mechanism 46 and the second locking mechanism 48 simultaneously from the locked state into the unlocked state.

2. While the second rail 28 is at the second predetermined position P2 with respect to the first rail 26, a user may also adopt the second operation mode to retract the second rail 28 with respect to the first rail 26 from the second predetermined position P2 in the second direction D2. To do so, the second locking mechanism 48 is unlocked from the blocking portion 42 in advance through the operating member 50. Then, the second rail 28 is retracted in the second direction D2, and while the second rail 28 goes through a predetermined section of the retracting process, the second element 54 and the first element 52 of the first locking mechanism 46 are sequentially moved over the blocking portion 42, thanks to the guiding portion 82 and the second guiding feature 80, allowing the second rail 28 to be further retracted with respect to the first rail 26 in the second direction D2.

While the present invention has been disclosed through the foregoing preferred embodiment, it should be understood that the embodiment is not intended to be restrictive of the scope of the invention. The scope of patent protection sought by the applicant is defined by the appended claims.

What is claimed is:

1. A slide rail assembly, comprising:
   a first rail having a front end and a blocking portion;
   a second rail displaceable with respect to the first rail, wherein the second rail has a first portion and a second portion;
   a first locking mechanism disposed at a first position of the second rail;
   a second locking mechanism disposed at a second position of the second rail; and
   an operating member operatively connected to concurrently actuate both the first locking mechanism and the second locking mechanism;
   wherein when the second rail is displaced to a first predetermined position from a retracted position with respect to the first rail in a first direction, the first locking mechanism is locked to the blocking portion of the first rail, with the first portion of the second rail extending beyond the front end of the first rail;
   wherein the first locking mechanism is unlockable from the blocking portion through operation of the operating member, thereby releasing the second rail to be displaced with respect to the first rail from the first predetermined position to a second predetermined position in the first direction, and once the second rail is displaced to the second predetermined position, the second locking mechanism is locked to the blocking portion of the first rail, with the second portion of the second rail extending beyond the front end of the first rail; and
   wherein the first locking mechanism and the second locking mechanism are configured to be driven from a locked state into an unlocked state through operation of the operating member, thereby releasing the second rail to be retracted with respect to the first rail in a second direction.

2. The slide rail assembly of claim 1, wherein the first rail has a rear end, and the blocking portion is located between the front end and the rear end.

3. The slide rail assembly of claim 2, wherein the blocking portion is adjacent to the front end of the first rail.

4. The slide rail assembly of claim 1, wherein the first locking mechanism includes a first element and a second element, and the first element and the second element are pivotally connected to the second rail.

5. The slide rail assembly of claim 4, further comprising a first base, wherein the first base includes a first elastic portion and a second elastic portion for providing an elastic force to the first element and the second element respectively.

6. The slide rail assembly of claim 5, wherein the first element includes a first guiding feature, and the first guiding feature guides the first element to move over a first side of the blocking portion to a second side of the blocking portion in the first direction.

7. The slide rail assembly of claim 6, wherein the first guiding feature is one of an inclined surface and a curved surface.

8. The slide rail assembly of claim 6, wherein when the second rail is at the first predetermined position, the first element and the second element are located at the two sides of the blocking portion respectively and are in the locked state.

9. The slide rail assembly of claim 8, wherein the first element and the second element are configured to enter the unlocked state from the locked state through operation of the operating member, thereby releasing the second rail to be displaced with respect to the first rail from the first predetermined position toward the second predetermined position in the first direction.

10. The slide rail assembly of claim 9, wherein the second locking mechanism includes a third element, and the third element is pivotally connected to the second rail.

11. The slide rail assembly of claim 10, further comprising a second base, wherein the second base includes a third elastic portion for providing an elastic force to the third element.

12. The slide rail assembly of claim 11, wherein the third element includes a guiding structure, and the guiding structure guides the third element to move over the first side of the blocking portion to the second side of the blocking portion in the first direction.

13. The slide rail assembly of claim 12, wherein the guiding structure is one of an inclined surface and a curved surface.

14. The slide rail assembly of claim 12, wherein when the second rail is at the second predetermined position, the third element is located at the second side of the blocking portion and is in the locked state.

15. The slide rail assembly of claim 14, wherein the third element, the second element, and the first element are configured to enter the unlocked state from the locked state through operation of the operating member, thereby releasing the second rail to be retracted with respect to the first rail from the second predetermined position in the second direction.

16. The slide rail assembly of claim 15, wherein the second element includes a guiding portion, and the guiding portion is one of an inclined surface and a curved surface to help the second element move over the second side of the blocking portion to the first side of the blocking portion.

17. The slide rail assembly of claim 15, wherein the first element further includes a second guiding feature, and the second guiding feature is one of an inclined surface and a curved surface to help the first element move over the second side of the blocking portion.

18. The slide rail assembly of claim 1, further comprising a third rail, wherein the first rail is movably mounted between the third rail and the second rail.

19. The A rail kit, comprising:
a slide rail;
a first locking mechanism and a second locking mechanism respectively disposed at two different positions of the slide rail, the first locking mechanism including a first element and a second element, the first element and the second element being pivotally connected to the slide rail, the second locking mechanism including a third element, the third element being pivotally connected to the slide rail;
an operating member coupled to concurrently actuate both the first locking mechanism and the second locking mechanism and thereby configure the first locking mechanism and the second locking mechanism from a locked state to an unlocked state;
a first base, and the first base including a first elastic portion and a second elastic portion for providing an elastic force to the first element and the second element respectively; and
a second base, the second base including a third elastic portion for providing an elastic force to the third element.

* * * * *